(12) United States Patent
Hebert (10) Patent No.: US 9,076,778 B2
(45) Date of Patent: Jul. 7, 2015

(54) SEMICONDUCTOR PACKAGE

(71) Applicant: MagnaChip Semiconductor, Ltd., Cheongju-si (KR)

(72) Inventor: Francois Hebert, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/104,754

(22) Filed: Dec. 12, 2013

(65) Prior Publication Data

US 2015/0001695 A1    Jan. 1, 2015

(30) Foreign Application Priority Data

Jun. 28, 2013  (KR) .................. 10-2013-0075968

(51) Int. Cl.
*H01L 23/495* (2006.01)
*H01L 23/00* (2006.01)
*H01L 23/31* (2006.01)

(52) U.S. Cl.
CPC ......... *H01L 23/4952* (2013.01); *H01L 23/3107* (2013.01); *H01L 23/49524* (2013.01); *H01L 23/49562* (2013.01); *H01L 24/34* (2013.01); *H01L 2224/0603* (2013.01); *H01L 2224/16245* (2013.01); *H01L 2224/48247* (2013.01); *H01L 2224/48472* (2013.01); *H01L 2224/49111* (2013.01); *H01L 2224/05553* (2013.01); *H01L 2224/0401* (2013.01); *H01L 2924/13091* (2013.01)

(58) Field of Classification Search
CPC .......... H01L 2224/48247; H01L 2224/48091; H01L 2924/01078; H01L 2924/01079; H01L 2924/01029
USPC ......... 257/666, 669, 667, 671, 676, 706, 675, 257/723
See application file for complete search history.

(56) References Cited

U.S. PATENT DOCUMENTS 7,923,300 B2    4/2011   Bell et al.
2012/0256193 A1*  10/2012  Hebert et al. .................. 257/77

* cited by examiner

*Primary Examiner* — Hoa B Trinh
(74) *Attorney, Agent, or Firm* — NSIP Law (57) ABSTRACT

Provided are a semiconductor die and a semiconductor package. The semiconductor package includes: a monolithic die; a driving circuit, a low-side output power device, and a high-side output power device disposed in the monolithic die; and an upper electrode and a lower electrode disposed above and below the monolithic die.

27 Claims, 6 Drawing Sheets

SEMICONDUCTOR PACKAGE

CROSS-REFERENCE TO RELATED APPLICATION

This application claims the benefit under 35 U.S.C. §119(a) of Korean Patent Application No. 10-2013-0075968 filed on 28 Jun. 2013, in the Korean Intellectual Property Office, the entire disclosure of which is incorporated herein by reference for all purposes.

BACKGROUND

1. Field

The following description relates to a semiconductor package, and to, for example, a semiconductor package in which a driving circuit, a low-side output power device and a high-side output power device are included in a monolithic type semiconductor die.

2. Description of Related Art

In recent years, demands on portable products have rapidly increased in the electronic product market. To meet the demand of making electronic products portable, parts that are used in portable systems have to be inevitably reduced in size, weight and thickness.

To produce parts that are minimized in size, weight and thickness, various technologies for size reduction of individual mounted parts are utilized. These technologies include system on chip (SOC) technology for making a plurality of individual devices into one chip, system in package (SIP) technology for integrating a plurality of individual devices into one package, and other similar technologies.

In recent years, with the trends of versatility of functions and miniaturization of mobile communication terminals, various parts embedded in terminals or modules embedded in a handset apparatus related thereto have been minimized in size. Mobile communication terminals include, for example, portable phones, personal digital assistants (PDAs), smart phones and other various terminals for media, such as MP3 players. Miniaturization technology also applies to other computing products such as tablet computers and new generation small-form-factor notebook computers referred to as UltraBooks. For miniaturization of the modules, studies on implementing parts of passive devices, active devices, and integrated circuit (IC) chips in one package have been attempted.

As a result, the number of module products is increasing, and various kinds of packages have been developed and released to support the growing demand of miniaturized modules. For example, companies have developed various package technologies that simultaneously improve an output power density of a semiconductor device and reduce production cost.

With this effort, 3D stacking technology for three-dimensionally coupling semiconductor dies has been developed, and semiconductor packages integrated as compared with the related art have been developed. However, since a driving circuit, a low-side output power device, and a high-side output power device are configured in separate semiconductor dies from each other, there are limitations on the integration of semiconductor packages.

The standard die is attached to a copper pad that is exposed at the bottom of the package. The pad is not a power electrode that carries high current. It is simply a thermal electrode. There is no backmetal on the back-side of standard monolithic buck converters. There is no electrical current flowing. The power ground is connected to separate pins on the periphery of the QFN package, and not connected to the bottom of the semiconductor die or the exposed pad (see Korean Laid-open Patent No. 10-2011-0074570 and US Laid-open patent No. 2013-0043940).

SUMMARY

In one general aspect, there is provided a semiconductor package, including: a monolithic die; a driving circuit, a low-side output power device, and a high-side output power device disposed in the monolithic die; and an upper electrode and a lower electrode disposed above and below the monolithic die, the lower electrode electrically connected to a power ground, in which the low-side output power device comprises a bottom-source type lateral double diffused metal oxide semiconductor (LDMOS).

The lower electrode may be electrically connected to a source region of the lower-side output power device.

The high-side output power device may include an LDMOS that is spaced apart from the low-side output power device.

The general aspect of the semiconductor package may further include a first lead frame in direct contact with the lower electrode.

The first lead frame may be electrically connected to the power ground.

The general aspect of the semiconductor package may further include a second lead frame electrically connected to the upper electrode.

The upper electrode may be electrically connected to an input node and a switching node of the monolithic die.

The second lead frame may be connected to the upper electrode through wire bonding or ribbon bonding.

The second lead frame may be connected to the upper electrode through a copper clip.

The copper clip may include two or more copper clips different from each other.

The general aspect of the semiconductor package may further include an encapsulant that encapsulates the driving circuit, the devices, and the upper and lower electrodes.

The encapsulant may encapsulate the semiconductor package, excluding a bottom side thereof.

The general aspect of the semiconductor package may further include a heat sink configured to dissipate heat generated inside the semiconductor package to outside.

In another general aspect, there is provided a semiconductor package, including: a monolithic die; a driving circuit, a low-side output power device, and a high-side output power device included in the monolithic die; an upper electrode and a lower electrode disposed above and below the monolithic die; and a copper clip in direct contact with the upper electrode, in which the low-side output power device comprises a bottom-source type lateral double diffused metal oxide semiconductor (LDMOS).

The upper electrode may be electrically connected to a source region of the lower-side output power device.

The high-side output power device may include a monolithic LDMOS isolated from the low-side output power device.

The lower electrode may be electrically connected to an input node and a switching node of the monolithic die.

The copper clip may be electrically connected to a power ground.

The copper clip may be only one in the semiconductor package.

The general aspect of the semiconductor package may further include a heat sink configured to dissipate heat generated from inside of the semiconductor package to outside, the heat sink disposed on top of the copper clip.

In another general aspect, there is provided a semiconductor die, including: a first lateral double diffused metal oxide semiconductor (LDMOS) formed on a semiconductor substrate; a second LDMOS isolated from the first LDMOS; and a power electrode formed below the semiconductor substrate, in which the power electrode is electrically connected to a source region of the first LDMOS, and is configured to allow a source current to flow out through a bottom side of the semiconductor package.

The semiconductor substrate may include a high concentration P type region.

The power electrode may be formed on a bottom surface of the high concentration P type region.

The source region of the first LDMOS may be electrically connected to the power electrode through a sinker or a trench filled with a conductor.

The first LDMOS may include a bottom-source type LDMOS.

The general aspect of the semiconductor die may further include a control circuit formed in the semiconductor substrate.

The control circuit, the first LDMOS, and the second LDMOS may be configured in a monolithic die.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It will be understood that, although the terms first, second, A, B, and the like may be used herein in reference to various elements, features and steps of devices and methods, such elements, features and steps should not be construed as limited by these terms. For example, a first element could be termed a second element, and a second element could be termed a first element, without departing from the scope of the present disclosure. Herein, the term "and/or" includes any and all combinations of one or more referents.

The terminology used herein is for the purpose of describing an example for illustrative purposes and is not intended to limit the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, various examples will be described with reference to the accompanying drawings.

Figure 11:
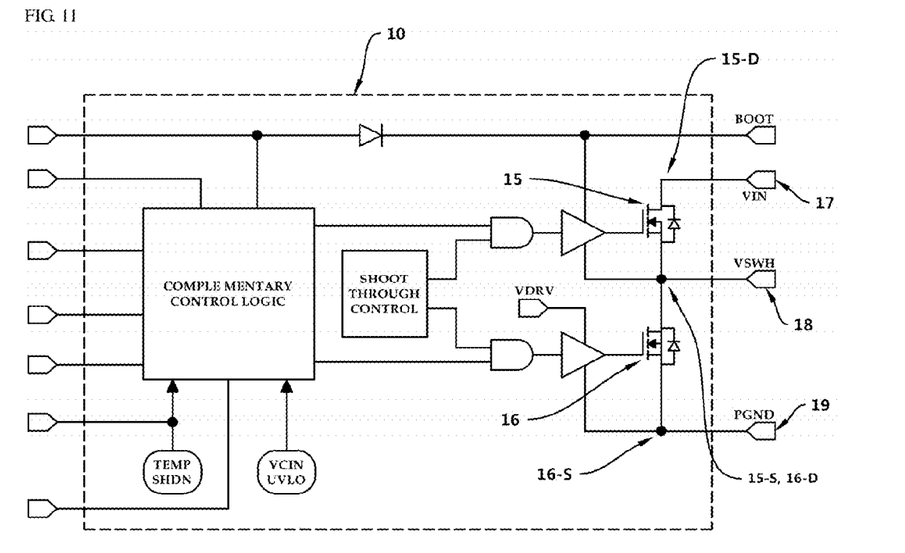
FIG. 11 is a schematic block diagram of an example of a power stage.

FIG. 11 is a schematic block diagram illustrating an example of a power stage. Referring to FIG. 11, a driving (or driver) circuit, a low-side output power device 16, a high-side output power device 15 are provided. Further, the driver circuit, the low-side output power device 16, and the high-side output power device 15 are formed on one semiconductor die 10. That is, the driver circuit, the low-side output power device 16, and the high-side output power device 15 may be fabricated to be packaged in a monolithic type or a monolithic die 10, which is indicated by a dotted line in FIG. 11. A gate controller circuit in addition to the driving circuit may be further included in the monolithic die 10.

A region of FIG. 11 indicated by the dotted line is a portion formed in the monolithic die 10, which also corresponds to a package outline. The monolithic die 10 may have an exposed bottom side that is not encapsulated. An input voltage Vin 17 is applied to the high-side output power device 15 at an input node, and a source region 16-S of the low-side output power device 16 is power-grounded by being connected to power ground 19. A junction point of the high-side and low-side output power devices is a source region 15-S of the high-side output power device and simultaneously a drain region 16-D of the low-side output power device. The junction point serves as a direct current (DC) current output or a switching node. Output of DC current or the switching node Vsw 18 is connected to the junction point of the source 15-S of high-side output power device and the drain region 16-D of the low-side output power device. Each of gates of the high-side output power device 15 and the low-side output power device 16 are connected to a logic device for a driving circuit or a gate controller circuit to receive a switching signal of the logic device or a signal for gate control.

Figure 1:
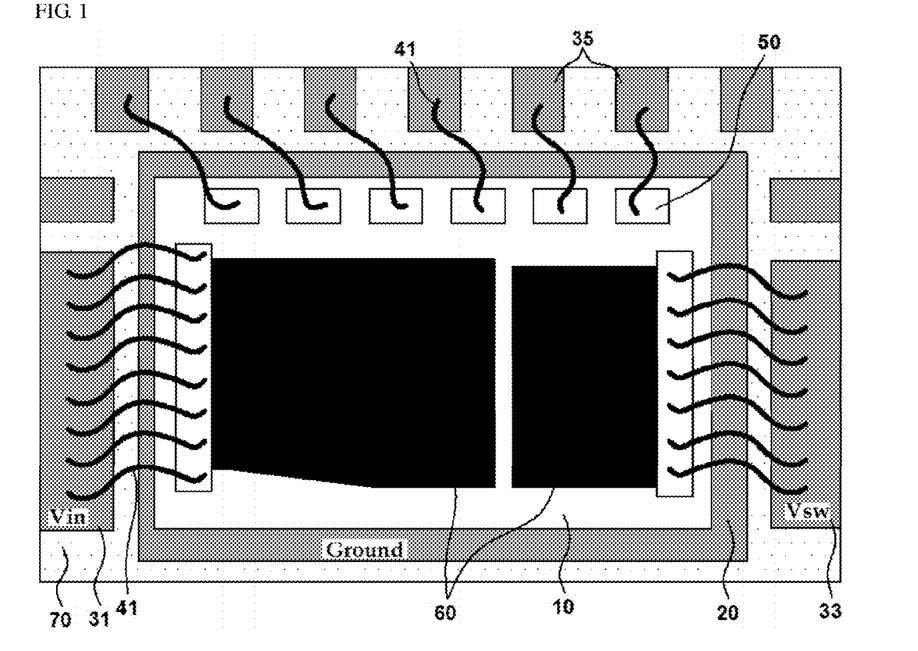
FIG. 1 is a top view of an example of a semiconductor package.
Figure 2:
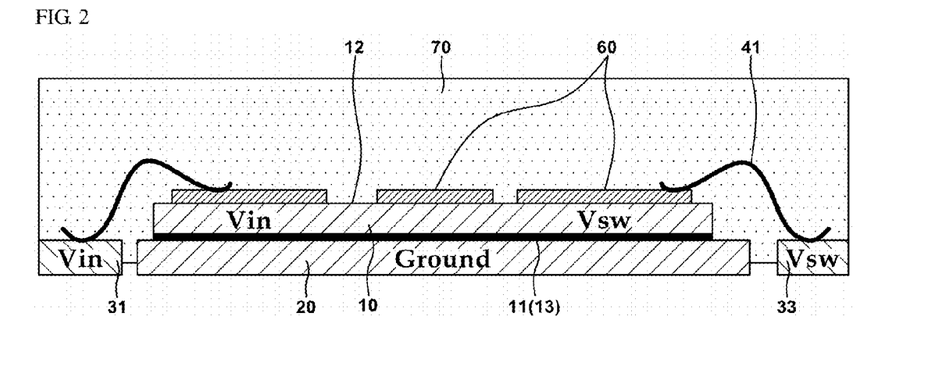
FIG. 2 is a side view of an example of a semiconductor package.

FIG. 1 illustrates a top view of an example of a semiconductor package according to the present disclosure, and FIG. 2 illustrates a side view of the semiconductor package.

Referring to FIGS. 1 and 2, an example of a semiconductor package includes a driving circuit, a low-side output power device, and a high-side output power device in a monolithic type, and an upper electrode and a lower electrode are formed on a top and a bottom of a monolithic die. The lower electrode may be configured of a backmetal 11, as illustrated in FIG. 2.

The semiconductor package may include: an unflipped semiconductor die 10; a lead frame 20 located in a bottom of the semiconductor die 10, and electrically connected to the backmetal 11 of the semiconductor die 10; second lead frames 31, 33, and 35 located in a peripheral portion of the semiconductor die 10, and located on the same plane as the first lead frame 20 as illustrated in FIG. 2; and a connection unit configured to electrically connect the semiconductor die 10 and the second lead frames 31, 33, and 35. In this example, the connection unit may include a bonding wire 41.

The driving circuit (or the controlling and driving circuit) configured to control driving of semiconductor devices, the low-side output power device electrically connected to a switching voltage and a ground voltage to be driven, and a high-side output power device electrically connected to an input voltage and a switching voltage to be driven are included in the semiconductor die 10 in a monolithic type. The semiconductor die 10 may be fabricated through various semiconductor processes, for example, BiCMOS, BCD and the like. The method for fabricating the semiconductor die 10 will be described below.

First, the semiconductor die 10 may include a P+ highly doped substrate and P type epitaxial layer formed on the substrate. Next, a low-cost simplified BCD process may be used for the driver circuit, or a full BCD process may be used for the controller circuit.

Also, the semiconductor die 10 may include a high-side output power device spaced apart (isolated) from the low-side output power device.

The semiconductor die 10 may be configured so that a source region of the low-side output power device is electrically connected to the substrate of the semiconductor die 10.

In one example, the low-side output power device and the substrate may be configured so that the source region of the low-side output power device is electrically connected to the backmetal formed on a bottom surface of the substrate by using one or more methods selected among a doping region configured of a sinker or a trench filled with a conductor (for example, doped polysilicon), a trench filled with a metal (silicide, tungsten, or a combination thereof), or a combination of the sinker and the trench, and a through silicon via (TSV).

The low-side output power device and the substrate may be configured so that the low-side output power device and the substrate may be electrically connected by a trench or a sinker formed in an active region of a low-side output power device.

The low-side output power device and the substrate may be configured so that the low-side output power device and the substrate may be electrically connected by a trench or a sinker formed in an outer periphery of the low-side output power device.

The low-side output power device and the substrate may be configured so that the low-side output power device and the substrate may be electrically connected by a trench or a sinker formed to be connected to the low-side output power device through a metal.

Referring to FIG. 2, the lower electrode or the backmetal 11 is formed on a bottom surface of the semiconductor die 10. The semiconductor substrate includes a P+ highly doped substrate that is a high concentration P type substrate, and the backmetal 11 is formed on a bottom surface of the high concentration P type substrate. The backmetal 11 may be formed by using various semiconductor fabrication processes. In this example, the backmetal 11 may include an electrical conductive material such as Ti/Ni/Ag or Ti/Ni/Au used in a discrete vertical power MOSFETS, or other metal such as CrAu, Ti/Al, Ti/Cu, and the like.

Referring to FIG. 2, the semiconductor die 10 includes the backmetal 11 and is formed of a thinned wafer. Thus, substrate resistance may be minimized.

The semiconductor die 10 may be formed in an unflipped state.

In one example, the low-side output power device may include a bottom-source type lateral double diffused metal oxide semiconductor (LDMOS or BS-LDMOS) device. For instance, the low-side output power device may include an LDMOS device having low specific resistance (Rsp) and low ON resistance (Rdson) as well as adequate breakdown voltage (BVdss) for the application. This may reduce the die size and costs.

The source region of the low-side output power device configured of the LDMOS is electrically connected to the backmetal 11 formed in a bottom of the semiconductor die 10 and the backmetal 11 is used as a power electrode connected to the power ground. Thus, the semiconductor package according to an example may increase efficiency of the low-side output power device and reduce parasitic capacitance and inductance, and reduce thermal resistance, generated therein.

In one example, the high-side output power device may include a monolithic LDMOS device isolated from the low-side output power device. That is, the high-side output power device may be formed to be spaced from the low-side output power device. In one example, the high-side output power device may also include an LDMOS device having low specific resistance (Rsp) and low ON resistance (Rdson) and sufficient breakdown voltage (BVdss) for the application. This reduces the die size and costs.

In one example, a technical term such as first and second is used to divide and easily describe total technical components, but these terms do not indicate that the components technical differ from each other. For example, a first lead frame and a second lead frame only divide total lead frames in area units, but do not indicate different technical components from each other. Further, an input lead frame, a switching lead frame, a control lead frame, and the like only divide total lead frames in area units, but the terms do not indicate components that technically differ from each other.

Referring back to FIG. 2, the first lead frame 20 is disposed to be in contact with the backmetal 11 on the bottom of the semiconductor die 10. The backmetal 11 corresponds to a lower electrode. In an example, the first lead frame 20 may be in contact with the bottom surface 13 of the semiconductor die 10 to be electrically connected to the backmetal 11 of the semiconductor die 10. In this example, the first lead frame 20 may include an electrical conductive material selected from the group consisting of Cu, a Cu alloy, nickel-palladium (Ni—Pd), nickel-palladium-gold (Ni—Pd—Au), solder-plated Cu, and a combination thereof.

In one example, the first lead frame 20 is electrically connected to a power ground. Since the first lead frame 20 is electrically connected to the power ground, the backmetal 11 formed on the bottom surface of the semiconductor die 10 is electrically connected to the power voltage. Therefore, the bottom surface of an example of the semiconductor package is grounded. That is, the backmetal of the semiconductor die is directly connected to a source of the LDMOS for the low-side output power device and allows a source current to flow out through the bottom surface of the semiconductor package.

Referring to FIG. 1, the second lead frames 31, 33, and 35 are disposed in a peripheral portion of the semiconductor die 10, and connected to the upper electrode 60 of the semiconductor die. The upper electrode 60 includes a conductive material such as Cu. The upper electrode 60 is electrically connected to an electrode for the input voltage Vin and an electrode for a switching voltage Vsw of the semiconductor die 10. Thus, the upper electrode may transfer an input signal and a switching signal. The upper electrode may be connected to an electrode for the ground voltage of the semiconductor die 10.

The second lead frames 31, 33, and 35 are disposed on the same plane as the first lead frame 20. Referring to FIGS. 1 and 2, the second lead frames 31, 33, and 35 are disposed on the same plane as the first lead frame 20 and disposed in front (or rear) and in the left and right of the semiconductor die 10 (or the first lead frame 20).

In one example, as illustrated in FIG. 1, the second lead frame may include an input lead frame 31 electrically connected to an input voltage, a switching lead frame 33 electrically connected to a switching voltage, and at least one control lead frame 35 configured to provide a driving control signal. The at least one control lead frame 35 may be disposed in one direction with respect to the semiconductor die 10. The input lead frame 31 may be disposed in another direction from the semiconductor die. For example, referring to FIG. 1, the at least one control lead frame 35 is disposed in an upper direction of the semiconductor die 10 in FIG. 1, while the input lead frame 31 is disposed to the left side of the semiconductor die 10. The switching lead frame 33 may be disposed in yet another direction. Referring to FIG. 1, the switching lead frame 33 is disposed to the right of the semiconductor die 10 on the basis of the control lead frame 35. However, the arrangement of the second lead frame is not limited thereto, and in another example, the input lead frame 31 and the switching lead frame 33 may be disposed in the right and left of the semiconductor die 10 with respect to the control lead frame 35 or the input lead frame 31, and the control lead frame 35 may be disposed to face each other. Further, the at least one control lead frame 35 may be disposed in two or more directions with respect to the semiconductor die 10. For example, the at least one control lead frame 35 may be disposed to the left side (or in the left side of FIG. 1) and to the right side (in the right side of FIG. 1) of the semiconductor die 10, or disposed in the upper side (in an upper side of FIG. 1) and the left side (in the left side of FIG. 1) of the semiconductor die 10.

Referring to FIG. 1, the connection unit electrically connects the semiconductor die 10 and the second lead frames 31, 33, and 35. For example, as illustrated in FIG. 1, the connection unit may electrically connect a top surface 12 of the semiconductor die 10 and the second lead frame 31, 33, and 35 through a bonding pad 50 of the semiconductor die 10. In addition, a connection unit configured to connect the input lead frame 31 and the switching lead frame 33 to the semiconductor die 10 may include a bonding wire 41 having a thickness of 0.8 to 2 mil. For example, a bonding wire 41 having a thickness of 2 mil (1 mil=0.001 inch) or ribbon bonding may be used. Further, the connection unit configured to connect the at least one control lead frame 35 to the semiconductor die 10 may include a bonding wire 41 having a thickness of 0.8 to 2 mil. The bonding wire 41 may, for example, having a thickness of 1 mil (1 mil=0.001 inch) or be ribbon bonding. Through the above-described configuration, the connection unit may provide the input voltage, the switching voltage, and a specific driving control signal to circuits included in the semiconductor die 10.

The bonding wire 41 may include an electrical conductive material selected from the group consisting of Cu, Au, aluminum (Al), and a combination thereof. Other than the above-described materials, the bonding wire 41 may include various electrical conductive materials.

To transfer the input voltage and the switching voltage transferred from the input lead frame 31 and the switching lead frame 33 to certain regions of the semiconductor die 10, a conductor to serve as the upper electrode 60 may be formed on the top surface 12 of the semiconductor die 10. At this time, the upper electrode 60 may include the conductor having the shape illustrated in FIG. 1 or a conductor having a shape illustrated in FIG. 3.

In one example, the semiconductor package may further include an encapsulant 70 configured to encapsulate the semiconductor die 10, the first lead frame 20, the second lead frames 31, 33, and 35, and the connection unit. Referring to FIG. 2, the encapsulant 70 may encapsulate the first lead frame 20 and the second lead frames 31, 33, and 35, excluding the bottom surfaces of the first and second lead frames 20 and 31, 33, and 35. The encapsulation by the encapsulant 70 results in a robust semiconductor package that is resistant against an external shock.

In one example, the semiconductor package may further include a heat sink (not shown) configured to dissipate heat generated from the devices therein to the outside. The heat sink may include a thermally conductive plug that includes, for example, Cu or other conductive material. The heat sink may be placed in contact with the large area power electrodes on the top of the die, and may be also affixed with a mold compound. The semiconductor package may control temperatures of the devices therein through the heat sink to improve endurance and performance thereof.

The semiconductor package including the connection unit such as the bonding wire 41 may be applied to a circuit driven with a low operating current because of the bond wire resistance which will limit the performance. For example, the semiconductor package may be applied to a circuit driven with a current of 2 to 6 Amperes or less.

Further, an example of the semiconductor package may be configured of only one semiconductor die 10 to provide a thinner semiconductor package.

Figure 4:
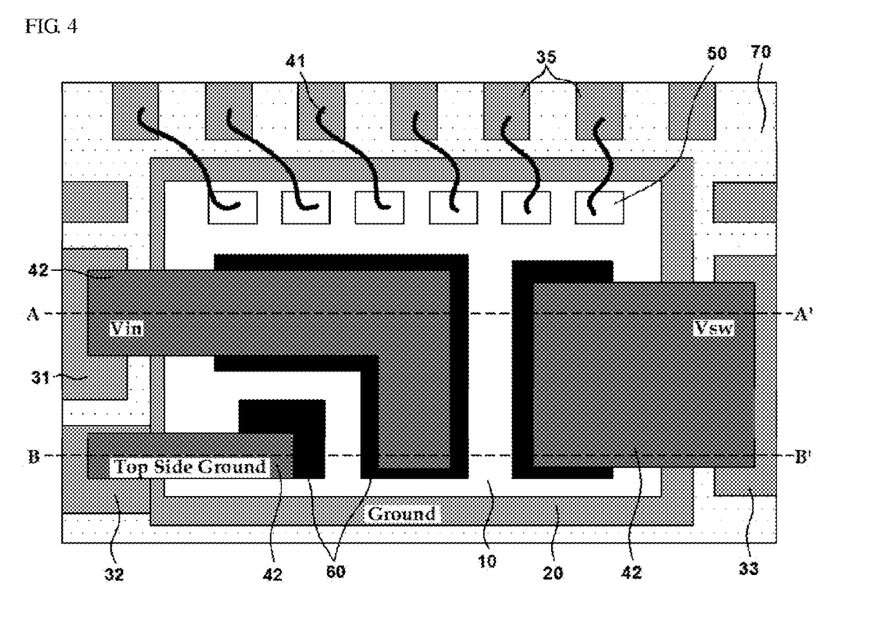
FIG. 4 is a top view of another example of a semiconductor package.
Figure 5:
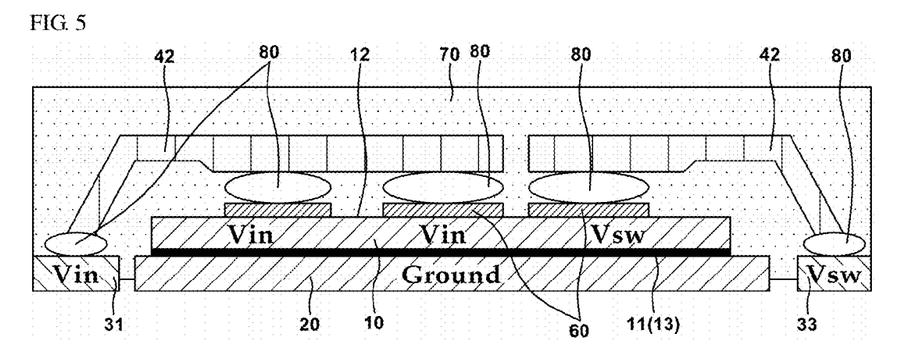
FIG. 5 is a cross-sectional view of the semiconductor package of FIG. 4 taken along line A-A'.
Figure 6:
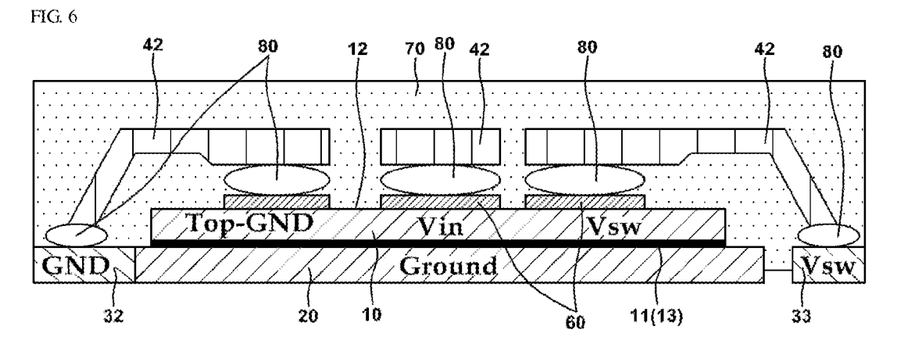
FIG. 6 is a cross-sectional view of the semiconductor package of FIG. 4 taken along line B-B'.

FIGS. 4 to 6 illustrate another example of a semiconductor package.

FIG. 4 is a top view illustrating an example of a semiconductor package, and FIGS. 5 and 6 are side views of the semiconductor package illustrated in FIG. 4.

Figure 3:
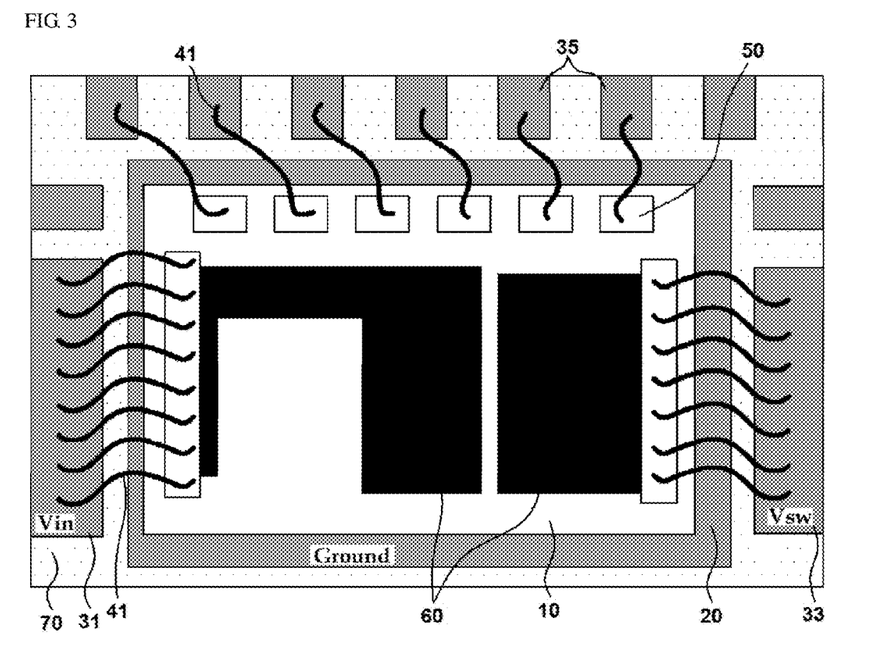
FIG. 3 is a top view of another example of a semiconductor package.

Referring to FIG. 4, unlike the semiconductor package illustrated in FIG. 3, in the semiconductor package of FIG. 4, an input voltage and a switching voltage may be electrically connected to the semiconductor die 10 through a connection unit configured of a copper clip 42. In this example, the semiconductor die 10 is not flipped.

Like the above-described example, a first lead frame 20 is disposed on the bottom of the semiconductor die 10. The first lead frame 20 is in contact with a bottom surface 13 of the semiconductor die 10 to be electrically connected to a backmetal 11 used for a lower electrode of the semiconductor die 10. The first lead frame 20 is electrically connected to a power ground. Since the first lead frame 20 is electrically connected to the power ground, the backmetal 11 formed on the bottom of the semiconductor die 10 is electrically connected to the power ground. Therefore, the bottom of the semiconductor package is grounded. That is, the backmetal 11 of the semiconductor die is directly connected to a source of the LDMOS for the low-side output power device, and allows a source current to flow out through the bottom of the semiconductor package For example, referring to FIG. 5, a second lead frame is directly physically connected to the copper clip electrically connected to the upper electrode 60. The second lead frame may include: an input lead frame 31 electrically connected to the input voltage through the copper clip 42; a top-side ground lead frame 32 electrically connected to a ground voltage through the copper clip 42; a switching lead frame 33 electrically connected to the switching voltage through the copper clip 42; and at least one control lead frame 35 configured to provide a driving control signal through a bonding wire 41. A conductive solder material 80 is formed between the upper electrode 60 and the copper clip 42 to be electrically connected to each other.

Referring to FIG. 4, the copper clip 42 may include two or more copper clips. This is because the copper clips are connected to an electrode for an input voltage, an electrode for a switching voltage, and an electrode for a ground voltage or a power electrode, respectively.

For example, referring to FIG. 4, the at least one control lead frame 35 is disposed in one direction (in an upper side of FIG. 4) with respect to the semiconductor die 10. The input lead frame 31 and the top-side ground lead frame 32 may be disposed to the left (in the left side of FIG. 4) of the semiconductor die 10 on the basis of the control lead frame 35. The switching lead frame 33 may be disposed to the right (in the right side of FIG. 4) of the semiconductor die 10 on the basis of the control lead frame 35. However, the arrangement of the second lead frame is not limited thereto. In another example, the input lead frame 31 and the switching lead frame 33 may be disposed in the right and left of the semiconductor die 10 with respect to the control lead frame 35, or the input lead frame 31 and the control lead frame 35 may be disposed to face each other. Further, the at least one control lead frame 35 may be disposed in two or more directions with respect to the semiconductor die 10. For example, the at least one control lead frame 35 may be disposed in the left and right of the semiconductor die 10 or disposed in the upper side and left of the semiconductor die 10.

The copper clip 42 configured to electrically connect the input lead frame 31, the top-side ground lead frame 32, and the switching lead frame 33 to the semiconductor die 10 may include an electrical conductive material such as Cu. FIGS. 5 and 6 illustrate cross-sectional views of a semiconductor package including the copper clip 42 having the above-described configuration, taken along lines A-A' and B-B' of FIG. 4.

An upper electrode 60 formed of a conductor may be formed on the semiconductor die 10 in order to transfer power from the input lead frame 31, the top-side ground lead frame 32, and the switching lead frame 33 to certain regions of the semiconductor die 10. A solder material 80 may be applied to affix the copper clip 42 to a connection unit of the lead frame, or to the upper electrode 60 of the semiconductor die 10.

Referring to FIG. 4, the semiconductor package may further include an encapsulant 70 configured to encapsulate the semiconductor die 10, the first lead frame 20, the second lead frame 31,32,33,35, and the copper clip 42. At this time, the encapsulant 70 may encapsulate the first lead frame 20 and the second lead frame 31, 32, 33, 35, except for the bottom surfaces of the first and second lead frames 20 and 31, 32, 33, 35. Thus, the encapsulation results in a robust semiconductor package resistant against an external shock.

In one example, the semiconductor package may further include a heat sink (not shown) configured to dissipate heat generated from the devices therein to the outside. The heat sink may include a thermally conductive plug that includes, for example, Cu or other conductive material. The heat sink may be placed in contact with the large area power electrodes on the top of the die, and may be also affixed with a mold compound. The semiconductor package may control temperatures of the devices therein through the heat sink to improve endurance and performance thereof.

The semiconductor package according to another example may be applied to a circuit driven with a high current by applying the copper clip 42. For instance, the semiconductor package may be applied to a circuit driven with a current of 6 Amperes or more.

FIGS. 7 to 10 are views illustrating another example of a semiconductor package.

Referring to FIGS. 7 to 10, a semiconductor package according to another example includes a semiconductor die 110 in which a driving circuit, a low-side output power device, and a high-side output power device are included in a monolithic type and a backmetal 111 is formed on a top 112 thereof to be flipped, first lead frames 121, 122, 123, and 125 disposed on a bottom of the semiconductor die 110 and electrically connected to a lower electrode formed on a bottom 113 of the semiconductor die 110, a second lead frame 130 disposed in a peripheral portion of the semiconductor die 110 and disposed on the same plane as the first lead frames 121, 122, 123, and 125, and a copper clip 140 configured to electrically connect an upper electrode 111 formed on the top 112 of the semiconductor die 110 to the second lead frame 130. Like the above-described example, the upper electrode 111 and the lower electrode 160 are formed on the top and the bottom of the monolithic die. As described above, a backmetal 111 is used as the upper electrode 111. The lower electrode 160 is electrically connected to an electrode for an input voltage, an electrode for a switching voltage, or an electrode for a ground voltage.

The driving circuit configured to control driving of semiconductor devices, the low-side output power device electrically connected to a switching voltage and a ground voltage to be driven, and a high-side output power device electrically connected to an input voltage and the switching voltage to be driven are included in the semiconductor die 110 in a monolithic type. The semiconductor die 110 may be fabricated through various semiconductor processes, for example, BiCMOS, BCD and the like.

The method for fabricating the semiconductor die 110 will be further described below.

First, the semiconductor die 110 may include a P+ highly doped substrate and P type epitaxial layer formed on the substrate. Next, a low-cost simplified BCD process may be performed for formation of a driver circuit, or a Full BCD process may be performed for formation of a controller circuit.

Also, the semiconductor die 110 may include the isolated high-side output power device.

The semiconductor die 110 may be configured so that a source region of the low-side output power device may be electrically connected to the lower electrode formed on a bottom of a substrate in the semiconductor die 110.

In an example, the low-side output power device and the substrate may be configured so that the low-side output power device is electrically connected to the substrate through any one or more methods selected among a doping region configured of a sinker or a trench filled with a conductor (for example, doped polysilicon), a trench filled with a metal (silicide, tungsten, or a combination thereof), or a combination of the sinker and the trench, and a through silicon via (TSV).

The low-side output power device and the substrate may be configured so that the low-side output power device and the substrate may be electrically connected by a trench or a sinker formed in an active region of a low-side output power device.

The low-side output power device and the substrate may be configured so that the source region of the low-side output power device and the lower electrode formed on the bottom of the substrate in the semiconductor die 110 may be electrically connected by trench or a sinker formed in an outer periphery of the low-side output power device.

The low-side output power device and the substrate may be configured so that the low-side output power device and the substrate may be electrically connected by a trench or a sinker formed to be connected to the low-side output power device through a metal.

Figure 9:
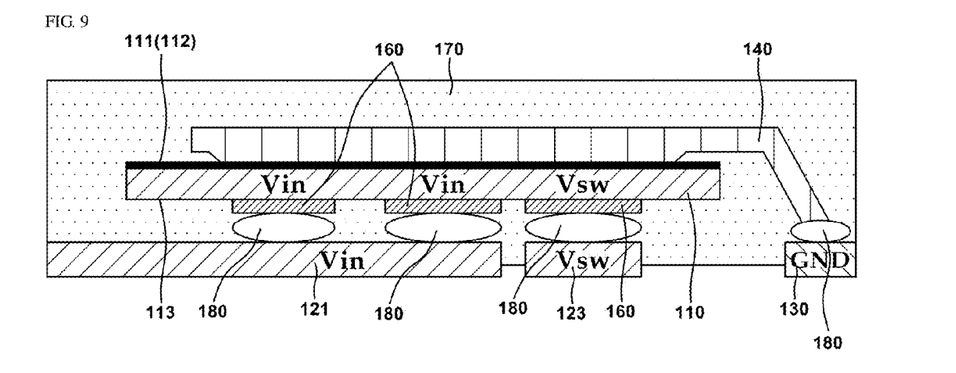
FIG. 9 is a cross-sectional view of the semiconductor package of FIG. 8 taken along line A-A'.
Figure 10:
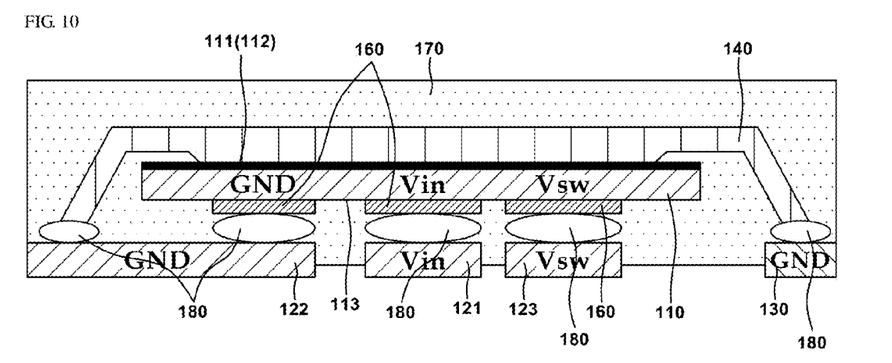
FIG. 10 is a cross-sectional view of the semiconductor package of FIG. 8 taken along line B-B'.

Referring to FIGS. 9 and 10, a backmetal 111 is formed on the top surface of the semiconductor die 110. The top surface of the semiconductor die 110 is a bottom surface of the monolithic die, but is illustrated as the top surface in FIGS. 9 and 10 because the die is provided on a lead frame in a flip chip position. The backmetal 111 may be formed by using various semiconductor fabrication processes. In one example, the backmetal 111 may include a metal such as Ti/Ni/Ag or Ti/Ni/Au standard backmetal used on discrete vertical power MOSFETS, or other electrical conductive materials such as CrAu, Ti/Al, Ti/Cu, and the like.

The semiconductor die 110 may be formed in a flipped state.

In one example, the low-side output power device may include a bottom-source type LDMOS (or BS-LDMOS) device. For instance, the low-side output power device may include an LDMOS device having low specific resistance (Rsp) and low ON resistance (Rdson) as well as adequate breakdown voltage (BVdss) for the application.

A source region of the LDMOS device is electrically connected to the backmetal 111 of the semiconductor die 110 and the backmetal 111 is used as a power electrode. That is, the backmetal of the semiconductor die is directly connected to the source of the LDMOS for the low-side output power device, and allows a source current to flow out through the bottom surface of the semiconductor package. Thus, the semiconductor package according to another example may increase efficiency of the low-side output power device and reduce parasitic capacitance and inductance generated therein.

In one example, the high-side output power device may include a monolithic LDMOS device isolated from the low-side output power device. For instance, the high-side output power device may also include an LDMOS device having low specific resistance (Rsp) and low ON resistance (Rdson) as well as adequate breakdown voltage (BVdss) for the application.

Figure 8:
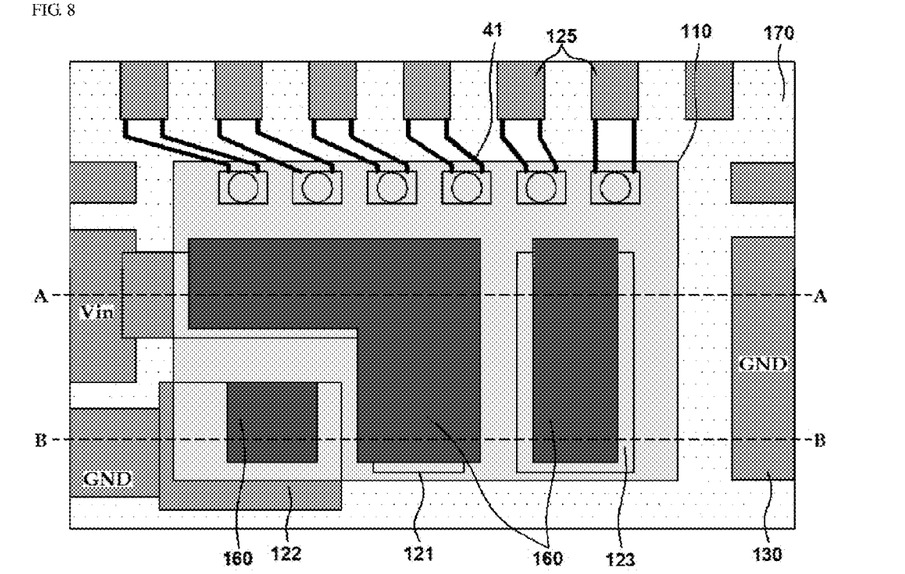
FIG. 8 is a top view of another example of a semiconductor package other than a copper clip.

Referring to FIG. 8, the first lead frames 121, 122, 123, and 125 are disposed on the bottom of the semiconductor die 110. The first lead frames 121, 122, 123, and 125 may be disposed on the bottom 113 of the semiconductor die 110 to be electrically connected to the driving circuit, low-side output power device, and high-side output power device of the semiconductor die 110. In this example, the monolithic die may be transparently represented to show the lead frames.

Referring to the example illustrated in FIG. 8, the first lead frames may include an input lead frame 121 electrically connected to an input voltage; a ground lead frame 122 electrically connected to a ground voltage; a switching lead frame 123 electrically connected to a switching voltage; and at least one control lead frame 125 configured to provide a driving control signal. The lead frames may be differently disposed according to positions and structures of configuration circuits included in the semiconductor die 110. In an example, the respective lead frames of the first lead frames 121, 122, 123, and 125 may be disposed as illustrated in FIG. 8, but the arrangement of the first lead frames 121, 122, 123, and 125 is not limited thereto.

The first lead frames 121, 122, 123, and 125 may include an electrical conductive material selected from the group consisting of Cu, a Cu alloy, Ni—Pd, nickel-palladium-gold (Ni—Pd—Au), and a combination thereof.

The second lead frame 130 is disposed in a peripheral portion of the semiconductor die 110 and disposed on the same plane as the first lead frame 120. Like the first lead frames 121, 122, 123, and 125, the second lead frame 130 may include an electrical conductive material selected from the group consisting of Cu, a Cu alloy, Ni—Pd, nickel-palladium-gold (Ni—Pd—Au), solder plated copper, and a combination thereof.

Figure 7:
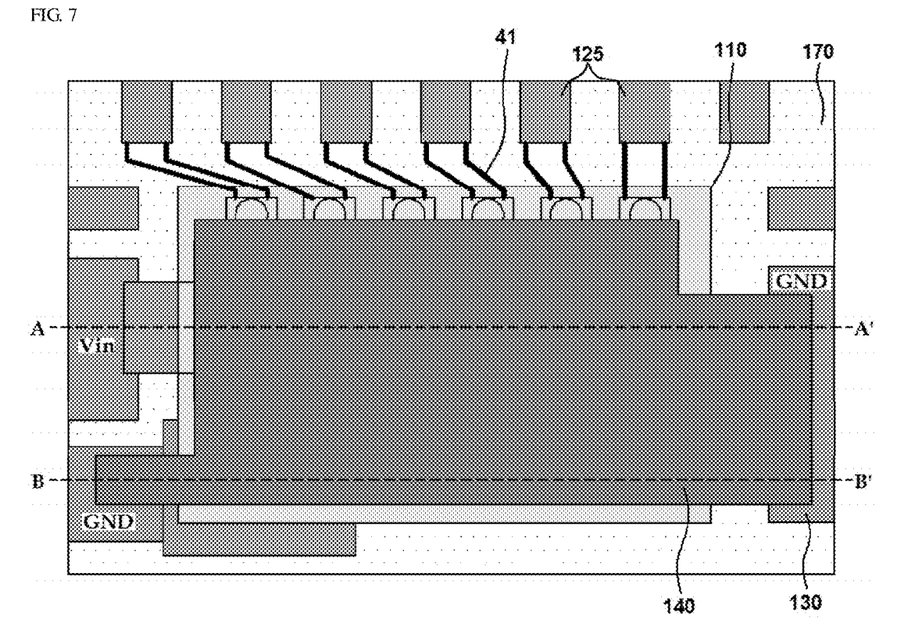
FIG. 7 is a top view of another example of a semiconductor package.

Referring to FIG. 7, the copper clip 140 is in contact with the backmetal 111 formed on the top of the semiconductor die 110. Therefore, the backmetal 111 formed on the top of the semiconductor die 110 and the second lead frame 130 are electrically connected through the copper clip 140. For instance, the copper clip 140 electrically connects the second lead frame 130 that is electrically connected to the ground voltage and the electrode of the semiconductor die 110.

FIGS. 9 and 10 illustrate cross-sectional views of the semiconductor package including the copper clip 140 having the above-described configuration, taken along lines A-A' and B-B' of FIG. 8.

A conductor 160 may be formed on the semiconductor die 110 in order to transfer power from the first lead frame, including the input lead frame 121, the ground lead frame 122, and the switching lead frame 123, to certain regions of the semiconductor die 110. In this example, a solder material 180 may be applied to affix the copper clip 140 and a connection unit of the lead frame, or to affix the semiconductor die 110 and the first lead frames 121, 122, and 123 together.

Figure 12:
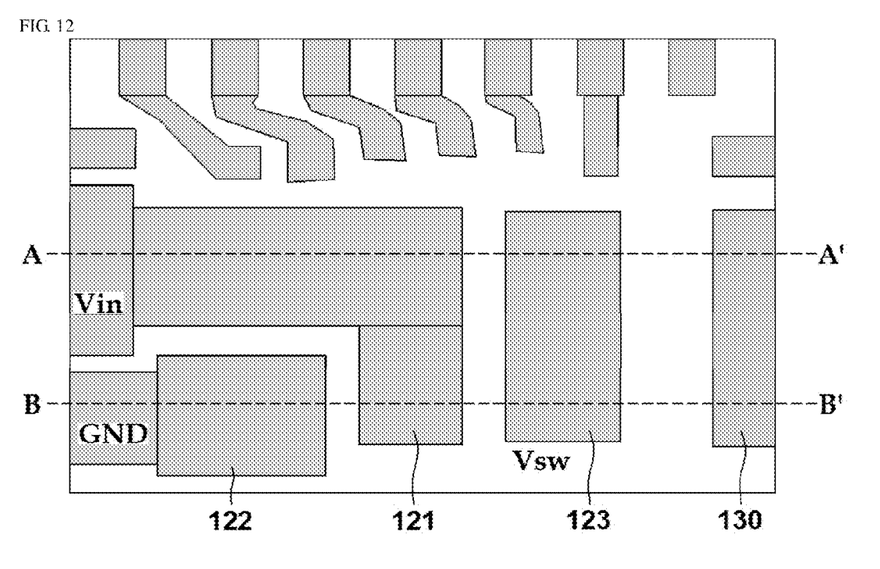
FIG. 12 is a view illustrating only first and second lead frames illustrated in FIGS. 7 to 10.

FIG. 12 is a cross-sectional view of the semiconductor package that illustrates only first and second lead frames. FIG. 12 illustrates the input lead frame 121, the ground lead frame 122, and the switching lead frame 123, and a ground lead frame used for the second lead frame, as described above.

The semiconductor package of FIG. 12 may further include an encapsulant 170 configured to encapsulate the semiconductor die 110, the first lead frames 121, 122, 123, and 125, the second lead frame 130, and the copper clip 140. In this example, the encapsulant 170 may encapsulate the first lead frames 121, 122, 123, and 125 and the second lead frame 130, excluding the bottom surfaces of the first and second lead frames 121, 122, 123, and 125, and 130. The encapsulation provides a robust semiconductor package that is resistant against an external shock.

In one example, the semiconductor package may further include a heat sink (not shown) configured to dissipate heat generated from the devices therein to the outside. The heat sink may include a thermally conductive plug that includes, for example Cu or other conductive material. The heat sink may be placed in contact with the large area power electrodes on the top of the die, and may be also affixed with a mold compound. The semiconductor package may control temperatures of the devices therein through the heat sink to improve endurance and performance.

The semiconductor package having the copper clip 140 may be applied to a circuit driven with a high current. For example, the semiconductor package may be applied to a circuit driven with a current of 6 Amperes or more.

A P type epitaxial layer that is formed on a substrate doped with P type impurities and into which high concentration P type impurities are doped may be used as the semiconductor substrate described in the above-described semiconductor packages.

According to one example of the present disclosure, a semiconductor package configured of a semiconductor die in which a controlling circuit, a low-side output power device, and a high-side output power device are included in a monolithic type die. Thus, the semiconductor package is well integrated as compared with other semiconductor packages with different arrangements of the controlling circuit, the low-side output power device and the high-side output power device.

Further, there is a provided a semiconductor package using the semiconductor substrate as a power electrode to reduce parasitic capacitance and inductance of a low-side output power device, and also improve thermal performance, while minimizing the total number of dies required.

The spatially-relative expressions such as "below", "beneath", "lower", "above", "upper" and the like may be used to conveniently describe relationships of one device or elements with other devices or elements. The spatially-relative expressions should be understood as encompassing the direction illustrated in the drawings, added with other directions of the device in use or operation. For example, a device explained as being located "below" or "beneath" another device may also be placed "above" said another device. That is, since the expression "below" or "beneath" is used to provide examples only, the expression may encompass both the upward and downward directions. Further, the device may be oriented to other directions and accordingly, the interpretation of the spatially-relative expressions is based on the orientation.

Further, the expression "a first conductive type" and "a second conductive type" may refer to the conductive types such as N and P types, or P and N types, which are opposed to each other. Examples explained and exemplified herein encompass complementary examples thereof.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor package, comprising:
   a monolithic die;
   a driving circuit, a low-side output power device, and a high-side output power device disposed in the monolithic die; and
   an upper electrode and a lower electrode disposed above and below the monolithic die, the lower electrode electrically connected to a power ground,
   wherein the low-side output power device comprises a bottom-source type lateral double diffused metal oxide semiconductor (LDMOS).

2. The semiconductor package of claim 1, wherein the lower electrode is electrically connected to a source region of the lower-side output power device.

3. The semiconductor package of claim 1, wherein the high-side output power device comprises an LDMOS that is spaced apart from the low-side output power device.

4. The semiconductor package of claim 1, further comprising a first lead frame in direct contact with the lower electrode.

5. The semiconductor package of claim 4, wherein the first lead frame is electrically connected to the power ground.

6. The semiconductor package of claim 1, further comprising a second lead frame electrically connected to the upper electrode.

7. The semiconductor package of claim 6, wherein the upper electrode is electrically connected to an input node and a switching node of the monolithic die.

8. The semiconductor package of claim 6, wherein the second lead frame is connected to the upper electrode through wire bonding or ribbon bonding.

9. The semiconductor package of claim 6, wherein the second lead frame is connected to the upper electrode through a copper clip.

10. The semiconductor package of claim 9, wherein the copper clip includes two or more copper clips different from each other.

11. The semiconductor package of claim 10, further comprising an encapsulant that encapsulates the driving circuit, the devices, and the upper and lower electrodes.

12. The semiconductor package of claim 11, wherein the encapsulant encapsulates the semiconductor package, excluding a bottom side thereof.

13. The semiconductor package of claim 1, further comprising a heat sink configured to dissipate heat generated inside the semiconductor package to outside.

14. A semiconductor package, comprising:
   a monolithic die;
   a driving circuit, a low-side output power device, and a high-side output power device included in the monolithic die;
   an upper electrode and a lower electrode disposed above and below the monolithic die; and
   a copper clip in direct contact with the upper electrode,
   wherein the low-side output power device comprises a bottom-source type lateral double diffused metal oxide semiconductor (LDMOS).

15. The semiconductor package of claim 14, wherein the upper electrode is electrically connected to a source region of the lower-side output power device.

16. The semiconductor package of claim 14, wherein the high-side output power device comprises a monolithic LDMOS isolated from the low-side output power device.

17. The semiconductor package of claim 14, wherein the lower electrode is electrically connected to an input node and a switching node of the monolithic die.

18. The semiconductor package of claim 14, wherein the copper clip is electrically connected to a power ground.

19. The semiconductor package of claim 14, wherein the copper clip is only one.

20. The semiconductor package of claim 14, further comprising a heat sink configured to dissipate heat generated from inside of the semiconductor package to outside, the heat sink disposed on top of the copper clip.

21. A semiconductor die, comprising:
   a first lateral double diffused metal oxide semiconductor (LDMOS) formed on a semiconductor substrate;
   a second LDMOS isolated from the first LDMOS; and
   a power electrode formed below the semiconductor substrate,
   wherein the power electrode is electrically connected to a source region of the first LDMOS, and is configured to allow a source current to flow out through a bottom side of the semiconductor package.

22. The semiconductor die of claim 21, wherein the semiconductor substrate comprises a high concentration P type region.

23. The semiconductor die of claim 21, wherein the power electrode is formed on a bottom surface of the high concentration P type region.

24. The semiconductor die of claim 21, wherein the source region of the first LDMOS is electrically connected to the power electrode through a sinker or a trench filled with a conductor.

25. The semiconductor die of claim 21, wherein the first LDMOS comprises a bottom-source type LDMOS.

26. The semiconductor die of claim 21, further comprising a control circuit formed in the semiconductor substrate.

27. The semiconductor die of claim 26, wherein the control circuit, the first LDMOS, and the second LDMOS are configured in a monolithic die.

* * * * *